United States Patent [19]

Kemner et al.

[11] Patent Number: 4,931,734
[45] Date of Patent: Jun. 5, 1990

[54] MAGNETIC RESONANCE APPARATUS HAVING A QUADRATURE RF COIL SYSTEM

[75] Inventors: Rudolf Kemner; Hilco T. Kalmijn, both of Eindhoven, Netherlands

[73] Assignee: U.S. Philips Corporation, New York, N.Y.

[21] Appl. No.: 336,174

[22] Filed: Apr. 11, 1989

[30] Foreign Application Priority Data

Apr. 26, 1988 [NL] Netherlands ............................ 8801079

[51] Int. Cl.⁵ .............................................. G01R 33/20
[52] U.S. Cl. ...................................... 324/318; 324/322
[58] Field of Search ............... 324/318, 322, 307, 309, 324/301, 302; 333/219

[56] References Cited

U.S. PATENT DOCUMENTS

| | | | |
|---|---|---|---|
| 3,131,367 | 4/1964 | Pitts et al. | 333/31 |
| 3,781,722 | 12/1973 | Pierson | 333/31 R |
| 4,682,128 | 7/1987 | Sproul et al. | 333/139 |
| 4,684,895 | 8/1987 | Misic | 324/322 |
| 4,833,429 | 5/1989 | Keren et al. | 333/156 |

OTHER PUBLICATIONS

M. O. Leach; The design and use of a dual-frequency surface coil providing proton images for improved localization in ³¹P spectroscopy of small lesions; Medical Physics, vol. 13, No. 4, Jul./Aug. 1986.
C. N. Chen. et al., "Quadrature Detection Coils—A Further 2 Improvement In Sensitivity", Journal of Magnetic Resonance, 54, 324-327, (1983).

*Primary Examiner*—Michael J. Tokar
*Attorney, Agent, or Firm*—William Squire

[57] ABSTRACT

A quadrature mode rf coil system in a magnetic resonance apparatus includes a pair of orthogonal rf coils which, for excitation and/or detection are coupled to an rf source or receiver by an electronic switching circuit built up from inductances and capacities. The switching circuit includes preferably frequency adjustable 90° first delay lines feeding each coil which transforms the 50Ω coil impedance of each coil to 100Ω so that the parallel combination of transformed impedances is 50Ω. A second 90° delay line is cascaded with the first delay line feeding one of the coils to establish a 90° phase difference between the coils.

9 Claims, 1 Drawing Sheet

MAGNETIC RESONANCE APPARATUS HAVING A QUADRATURE RF COIL SYSTEM

BACKGROUND OF THE INVENTION

1. Field of the Invention

The invention relates to a magnetic resonance apparatus having a quadrature mode radio-frequency coil system in which two coils are incorporated in an electric switching circuit for generating and/or detecting magnetic resonance signals.

2. Description of the Prior Art

Of interest is copending application Ser. No. 333,057, filed Apr. 3, 1989 entitled Quadrature RF Coil system for MR Apparatus in the name of Van Vaals and assigned to the assignee of the present invention. Such an apparatus is disclosed in EP 196134 corresponding to U.S. Pat. No. 4,712,069, by the same inventor as herein. The advantages of the quadrature coil system described in said Specification in a magnetic resonance apparatus are a better signal-to-noise ratio and a reduction of eddy current disturbances and of the required supply energy. The very disturbing phase shift between excitation and detection occurring when quadrature coils are used in magnetic resonance measurements is avoided there by incorporating in a switching circuit for matching impedance and phase upon excitation and detection a first ¼ μ conductor connecting the first and the second coil and a second ¼ μ conductor connecting the second coil. A drawback of this solution is that the ¼ μ conductors constitute comparatively clumsy elements and for each frequency must have a different length.

SUMMARY OF THE INVENTION

It is the object of the invention to avoid these drawbacks and for that purpose a magnetic resonance apparatus of the type mentioned in the opening paragraph is characterized in that the switching circuit for both quadrature coils, each separately matched at 50 Ω matches the combination of the coils to 50 Ω and includes an inductance and capacitance induced 90° delay line.

By means of a switching circuit according to the invention the use of the ¼ μ coaxial cables is avoided and a phase-shift which is more compact and can easily be adapted in frequency has been realized. During excitation, the switching circuit is connected to an rf transmitter, and during detection it is connected, preferably via a pre-amplifier, to a detection device.

In a preferred embodiment electronically switchable impedance matching and echo or excitation delay means have been provided for the detection of magnetic resonance signals in a quadrature mode. Said means may comprise, in particular, a 90° echo or excitation delay in each of the rf coil lines to be selectively short-circuited by means such as a PIN diode circuit. For optimum configuration each 90° delay is preferably constructed so as to be programmable. For this purpose both a controllable capacitor and a controllable inductance, and both, may be used.

In a further preferred embodiment an rf coil system is constructed only for detection as a quadrature coil system while for excitation, for example, a separate rf coil is used and a 90° echo delay is incorporated in only one of the coil lines of the rf system.

A few preferred embodiments according to the invention will now be described in greater detail with reference to the drawing, in which:

DETAILED DESCRIPTION OF THE PREFERRED EMBODIMENTS

Figure 1:
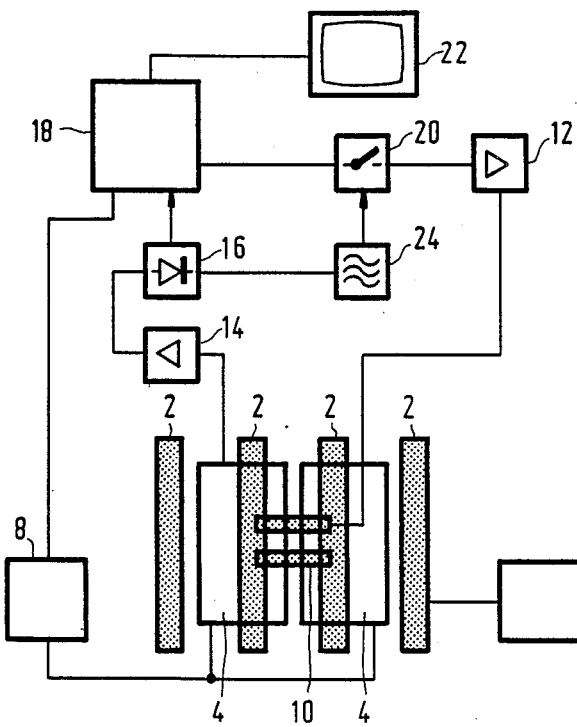
FIG. 1 shows a block diagram of a magnetic resonance apparatus including a radio-frequency coil system.

A magnetic resonance apparatus as shown in FIG. 1 comprises magnet coils 2 for generating a stationary magnetic field, magnet coils 4 for generating a gradient field, a supply source 6 for the magnet coils 2 and a supply source B for the magnet coils 4. The apparatus further comprises a system of coils 10 which in this case serves both for generating a radio-frequency pulsated magnetic field—and for that purpose can be connected to a radio-frequency source 12—and for detecting nuclear spin resonance generated in an object to be measured by the radio-frequency field. For detection the system of coils 10 is connected to a detection amplifier 14. The amplifier 14 is connected to a rectifier 16 which is connected to a central control device 18. The central control device 18 further controls a modulator 20 for the radio-frequency source 12, the supply source 8 for the gradient field and a monitor 22 for imaging. A high frequency oscillator 24 controls the modulator 20 for the radio-frequency source 12 and the phase-sensitive rectifier 16 processing the measured signals.

Figure 2:
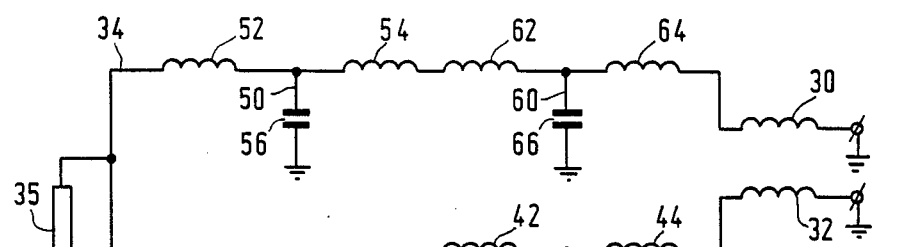
FIG. 2 is a circuit diagram for transmitter excitation of the radio-frequency coil system of FIG. 1.

FIG. 2 shows a first quadrature coil 30 and a second quadrature coil 32 which are oriented to produce orthogonal magnetic fields and are each matched at 50 Ω. A radio-frequency source 33 with a 50 Ω source resistor 35 is incorporated for driving both coils from an input port (terminal 80) via parallel branches formed by coupling networks or connections 34, 36. The first coil 30 is connected, via connection or coupling network 34, to the source 33 and the second coil 32 is connected, via connection or coupling network 36, to the source 33. For impedance matching purposes, it is desired that each of the coils should be driven with a phase shift or delay of 90° having an impedance transformation characteristic. In the circuit diagram this has been realized by incorporating in the connection or network 36 a 90° phase delay line 40 in the form of a first "T" network, having a first inductance 42, a second inductance 44 and a capacitance 46 and, incorporating in the connection or network 34 a 90° phase delay line 50, in the form of a similar "T" network, having a first inductance 52, a second inductance 54 and a capacitance 56. An additional 90° phase delay, for quadrature mode, is provided by incorporating in the connection 34 a second "T" network or echo line 60 having a first inductance 62, a second inductance 64 and a capacitance 66. In a practical construction the inductances 54 and 62 are combined to form one single inductance.

For example, for a 1.5 Tesla magnetic resonance apparatus having a Larmor frequency of 64 MHz the following value for the various circuit elements can be computed for the circuit diagram:

| | |
|---|---|
| Inductances 42 and 44: | 0.176 μH |
| Capacity 46: | 35.2 pF |
| Inductances 52 and 54: | 0.176 μH |
| Capacity 56: | 35.2 pF |
| Inductances 62 and 64: | 0.124 μH |
| Capacity 66: | 49.7 pF. |

It should be noted that for the first "T" networks the inductances 42, 44, 52 and 54 and the capacitances 46 and 56 are chosen so that L and C are resonant at the Larmor frequency and that $L/C = 50\ \Omega \times 100\ \Omega$ to transform each coil impedance from 50 Ω to 100 Ω, so that the transformed impedances combine in parallel to 50 Ω. For the second "T" network, the inductances 62 and 64 and the capacitance 66, L and C, also being resonant at the Larmor frequency, are chosen so that $L/C = 50\ \Omega \times 50\ \Omega$ for no impedance transformation. The various inductances and capacitances may each be selectable or controllable to allow operation at a selectable frequency of interest.

Figure 3:
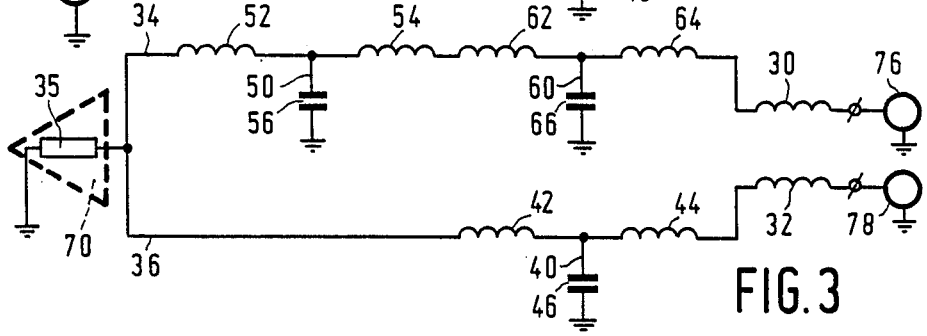
FIG. 3 shows a circuit diagram for utilizing the radio-frequency coil system for detection.

Each of the connections or networks 34 and 36 may advantageously contain the second "T" network 60, each such network being provided with selective short-circuit pin diode means (not shown) for selectively shunting one of such networks while the other remains active. This allows the signal at one of the coils 30 or 32 to selectively lead or selectively lag the signal at the other by 90°. It should be understood that a different one of the second "T" networks may be advantageously active for excitation or for detection. For convenience, in the circuit diagram for detection as shown in FIG. 3 corresponding circuit elements are referred to by the same reference numerals. The place of the supply source 33 with the source resistor 35 in this case is occupied by a pre-amplifier 70 having a 50 Ω input resistor 35. The coils 30 and 32 corresponding to the circuit diagram of FIG. 2 may be both the same coils and they may be replaced by a coil, for example, a body coil in the form of a birdcage coil, better suitable for generating a transmitting field. To illustrate that the circuit of FIG. 3 applies to detection, signal sources 76 and 78 induce magnetic resonance signals in the coils 30 and 32. It holds for a signal of the source 76 that s=C Cos wt; for the source 78 it holds that s =C Sin wt.

It is further to be noted that the use of quadrature mode only for detection yields a detection signal-to-noise ratio which is approximately 3 dB higher than when a single detection coil is used.

We claim:

1. In a magnetic resonance apparatus including a magnet system for generating a steady magnetic field, said magnet system comprising a radio-frequency coil system in which two coils are oriented to produce orthogonal magnetic fields in response to an applied radio-frequency signal, said coils being coupled in circuit with an electric switched circuit for generating and detecting magnetic resonance signals in a quadrature mode in accordance with the switched state of said circuit, impedance matching and signal delay means in circuit with said coils comprising:

a first branch coupled to one coil and a second branch coupled to the other coil, said branches being arranged to be selectively coupled to a radio-frequency signal source in one switch state and to magnetic field detection means in a second switch state; and first and second inductance and capacitance means coupled to a respective different coil in a respective different branch, said first and second inductance and capacitance means for impedance matching said branches and for inducing a 90° phase delay of said applied radio-frequency signal propagating in each said branch.

2. A magnetic resonance apparatus as claimed in claim 10, characterized in that both coils of the radio-frequency coil system are surface coils which are arranged in quadrature mode.

3. A magnetic resonance apparatus as claimed in claim 10, characterized in that one of the coils of the radio-frequency coil system is a transmitter coil adapted to optimum drive and the other coil is a surface coil for detection.

4. A magnetic resonance apparatus as claimed in claim 1, characterized in that one of said branches includes an additional 90° phase delay line in circuit therewith.

5. In a magnetic resonance apparatus including an rf coil system for exciting and detecting magnetic resonance signals in a quadrature mode comprising:

a port for rf signal input to and rf signal output from said coil system;

first and second rf coils oriented for generating rf magnetic fields respectively orthogonal to each other;

first and second networks of discrete inductance and capacitance respectively coupling said first and second coils to said port, each of said networks being characterized by an impedance matching characteristic and by a phase delay at a frequency of operation; and wherein:

said first and second networks respectively independently match said first and second coils to the same predetermined impedance; and the phase delays of the first and second networks are different by 90°.

6. The coil system of claim 5 wherein said first and second networks comprise "T" networks.

7. The coil system of claim 6 wherein said first network comprises two cascaded "T" networks.

8. The coil system of claim 5 wherein said first network has a 180° phase delay and said second network has a 90° phase delay.

9. The coil system of claim 5 wherein each coil has the same impedance, said first and second networks matching by transforming said coil impedance to a transformed impedance of double said coil impedance, the transformed impedances of the first and second coils appearing in parallel with each other at said port.

* * * * *